United States Patent
Kwak et al.

(10) Patent No.: US 10,032,641 B2
(45) Date of Patent: Jul. 24, 2018

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Dae-Young Kwak, Seongnam-si (KR); Kyung-Seok Oh, Seoul (KR); Seung-Jae Lee, Hwaseong-si (KR); Sang-Jin Hyun, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/137,946

(22) Filed: Apr. 25, 2016

(65) Prior Publication Data

US 2016/0380050 A1   Dec. 29, 2016

(30) Foreign Application Priority Data

Jun. 25, 2015   (KR) .................. 10-2015-0090290

(51) Int. Cl.
*H01L 27/088*   (2006.01)
*H01L 21/31*   (2006.01)
*H01L 21/8234*   (2006.01)

(52) U.S. Cl.
CPC ...... *H01L 21/31* (2013.01); *H01L 21/823431* (2013.01); *H01L 27/0886* (2013.01)

(58) Field of Classification Search
CPC .................................................. H01L 29/0649
USPC ....................................................... 257/401
See application file for complete search history.

(56) References Cited

U.S. PATENT DOCUMENTS

| | | | |
|---|---|---|---|
| 6,030,881 A | 2/2000 | Papasouliotis et al. | |
| 6,657,276 B1 | 12/2003 | Karlsson et al. | |
| 7,135,402 B2 | 11/2006 | Lin et al. | |
| 7,459,359 B2 * | 12/2008 | Park | H01L 29/66795 257/E21.014 |
| 7,563,689 B2 | 7/2009 | Hong | |
| 7,592,675 B2 | 9/2009 | Liaw | |
| 7,655,533 B2 * | 2/2010 | Sheen | H01L 29/66795 257/E21.56 |
| 7,659,179 B2 | 2/2010 | Hu | |
| 7,728,381 B2 | 6/2010 | Kahng et al. | |

(Continued)

FOREIGN PATENT DOCUMENTS

| | | |
|---|---|---|
| JP | 2002-246480 | 8/2002 |
| JP | 5160739 | 12/2012 |

(Continued)

*Primary Examiner* — Igwe U Anya
(74) *Attorney, Agent, or Firm* — F. Chau & Associates, LLC

(57) ABSTRACT

A semiconductor device is provided as follows. A first fin-type pattern is disposed on a substrate. A first field insulating film is adjacent to a sidewall of the first fin-type pattern. A second field insulating film is adjacent to a sidewall of the first field insulating film. The first field insulating film is interposed between the first fin-type pattern and the second field insulating film. The second field insulating film comprises a first region and a second region. The first region is closer to the sidewall of the first field insulating film. A height from a bottom of the second field insulating film to an upper surface of the second region is larger than a height from the bottom of the second field insulating film to an upper surface of the first region.

20 Claims, 22 Drawing Sheets

(56) References Cited

U.S. PATENT DOCUMENTS

| | | | |
|---|---|---|---|
| 8,497,175 B2 | 7/2013 | Kahng et al. | |
| 8,546,268 B2 | 10/2013 | Entalai et al. | |
| 8,642,459 B2 | 2/2014 | Poelzl | |
| 8,809,163 B2 | 8/2014 | Liu et al. | |
| 8,846,466 B2 | 9/2014 | Yuan et al. | |
| 2002/0111046 A1 | 8/2002 | Park et al. | |
| 2011/0097889 A1* | 4/2011 | Yuan | H01L 21/76224 438/595 |
| 2012/0299110 A1 | 11/2012 | Hung et al. | |
| 2013/0175627 A1* | 7/2013 | Goldbach | H01L 27/1104 257/350 |
| 2014/0264572 A1* | 9/2014 | Kim | H01L 21/3083 257/331 |
| 2014/0349464 A1 | 11/2014 | Yang et al. | |
| 2014/0357061 A1* | 12/2014 | Kim | H01L 29/785 438/479 |
| 2014/0374828 A1* | 12/2014 | Song | H01L 27/10826 257/347 |
| 2017/0005014 A1* | 1/2017 | Yamashita | H01L 22/12 |

FOREIGN PATENT DOCUMENTS

| | | |
|---|---|---|
| KR | 10-0744137 | 7/2007 |
| KR | 1020100116042 | 10/2010 |

\* cited by examiner

1400

SEMICONDUCTOR DEVICE AND METHOD OF FABRICATING THE SAME

CROSS-REFERENCE TO RELATED APPLICATION

This application claims priority under 35 U.S.C. § 119 to Korean Patent Application No. 10-2015-0090290, filed on Jun. 25, 2015 in the Korean Intellectual Property Office, the disclosure of which is incorporated by reference herein in its entirety.

TECHNICAL FIELD

The present inventive concept relates to a semiconductor device and a method of fabricating the same.

DISCUSSION OF RELATED ART

Multigate transistors have been suggested. The multigate transistors are easy to scale down, securing transistor performances. Without the increase of gate length of the multigate transistors, current control capability may be increased and short channel effects (SCE) may be suppressed.

SUMMARY

According to an exemplary embodiment of the present inventive concept, a semiconductor device is provided as follows. A first fin-type pattern is disposed on a substrate. A first field insulating film is adjacent to a sidewall of the first fin-type pattern. A second field insulating film is adjacent to a sidewall of the first field insulating film. The first field insulating film is interposed between the first fin-type pattern and the second field insulating film. The second field insulating film comprises a first region and a second region. The first region is closer to the sidewall of the first field insulating film. A height from a bottom of the second field insulating film to an upper surface of the second region is larger than a height from the bottom of the second field insulating film to an upper surface of the first region.

According to an exemplary embodiment of the present inventive concept, a semiconductor device is provided as follows. A first and a second fin-type patterns are spaced from each other. A first trench is disposed between the first and the second fin-type patterns. A first field insulating film having a recess is disposed in the first trench. A second field insulating film is disposed in the recess.

According to an exemplary embodiment of the present inventive concept, a semiconductor device is provided as follows. A first trench is disposed in a substrate. A first field insulating film is disposed in the first trench. A second trench penetrates the first field insulating film. A bottom surface of the second trench is lower than a bottom surface of the first trench. A second field insulating film is disposed in the second trench. A recess is formed within the second field insulating film. A third field insulating film is disposed in the recess. An upper surface of the third field insulating film is higher than an upper surface of an uppermost portion of the second field insulating film.

According to an exemplary embodiment of the present inventive concept, a method of fabricating a semiconductor device is provided as follows. A first trench and a fin-type pattern are formed, and the fin-type pattern is adjacent to the first trench. A first field insulating film fills the first trench. A second trench is formed within the first trench by partially etching the first field insulating film. A bottom surface of the second trench is lower than a bottom surface of the first trench. A second field insulating film is formed in the second trench. The first and the second field insulating films are simultaneously etched to partially expose the fin type pattern. After the simultaneous etching of the first and the second field insulating films, an upper surface of the second field insulating film is formed higher than the first field insulating film due to a difference in etch selectivity.

According to an exemplary embodiment of the present inventive concept, a method of fabricating a semiconductor device is provided as follows. First and second fin-type active patterns are formed on a substrate. A first preliminary field insulating film, a second preliminary field insulating film, and a third preliminary field insulating film are formed in a first region between the first and the second fin-type active patterns. Upper surfaces of the first, the second and the third preliminary field insulating films and upper surfaces of the first and the second fin-type active patterns are substantially coplanar with each other. The third preliminary field insulating film is interposed between the first and the second preliminary field insulating films. A bottom surface of the third preliminary field insulating film is lower than bottom surfaces of the first and the second preliminary field insulating films. A first etching process is performed at a first etch rate on the third preliminary field insulating film to form a third field insulating film. An upper surface of the third field insulating film is lower than the upper surfaces of the first and the second fin-type active patterns. A second etching process is performed at a second etch rate on the first and the second preliminary field insulating films to form first and second field insulating films so that upper surfaces of the first and the second field insulating films are lower than the upper surface of the third field insulating film. The first etching process and the second etching process are simultaneously performed and the first etch rate is smaller than the second etch rate.

BRIEF DESCRIPTION OF DRAWINGS

These and other features of the inventive concept will become more apparent by describing in detail exemplary embodiments thereof with reference to the accompanying drawings of which.

Figure 1:
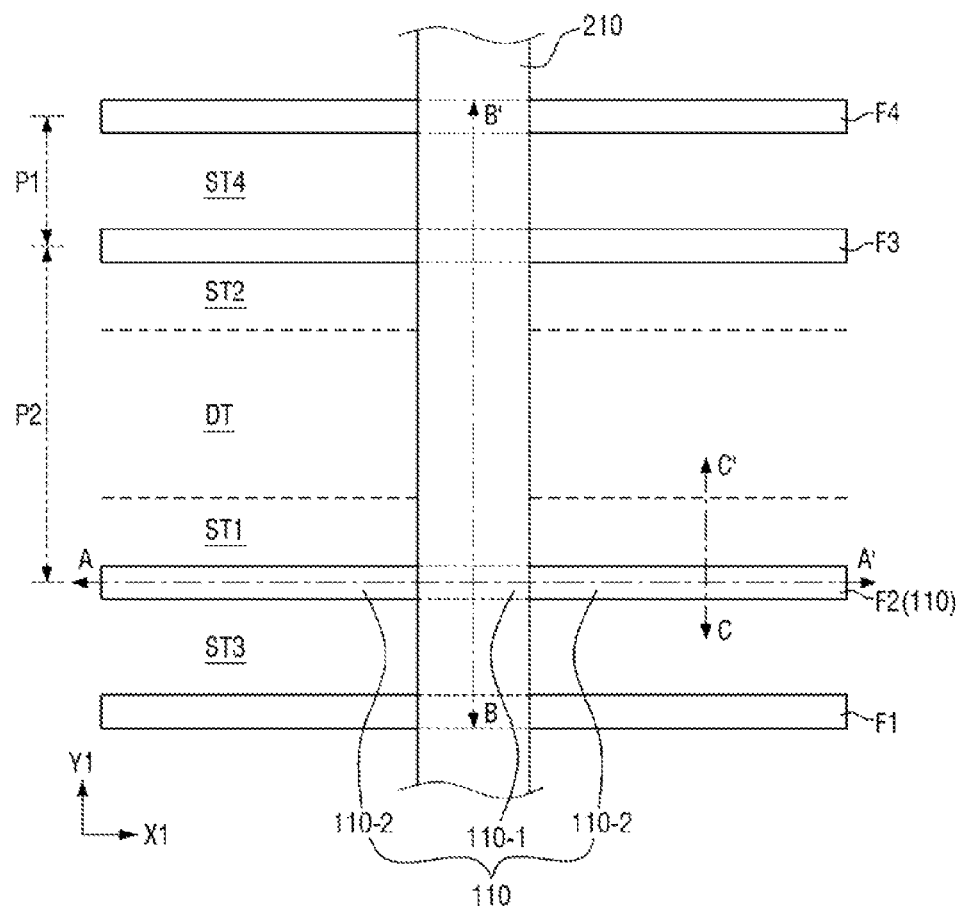
FIG. 1 is a layout diagram of a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinbelow, a semiconductor device according to an exemplary embodiment will be explained with reference to FIGS. 1 to 4.

Figure 2:
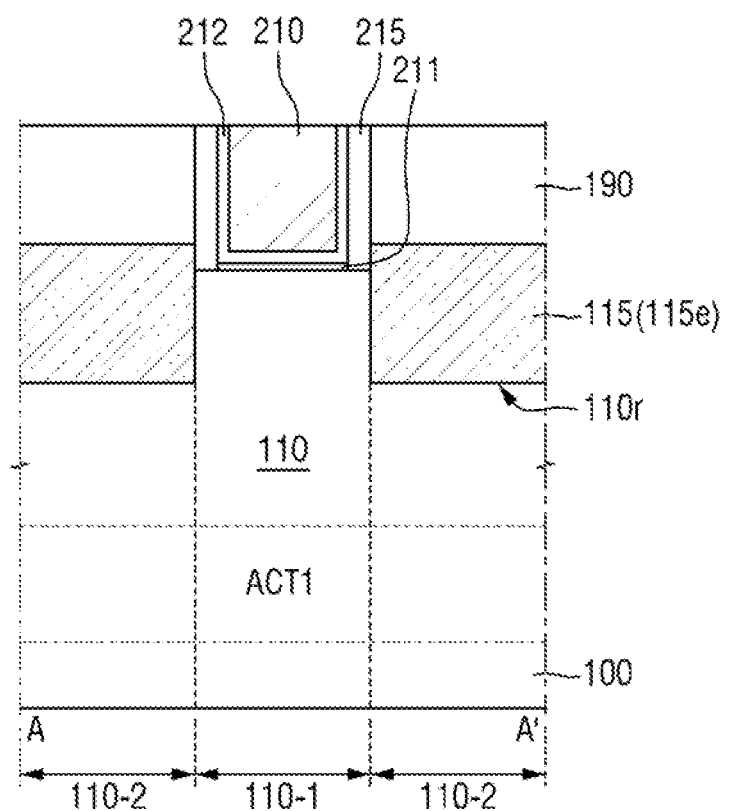
FIG. 2 is a cross sectional view taken along line A-A' of FIG. 1.
Figure 3:
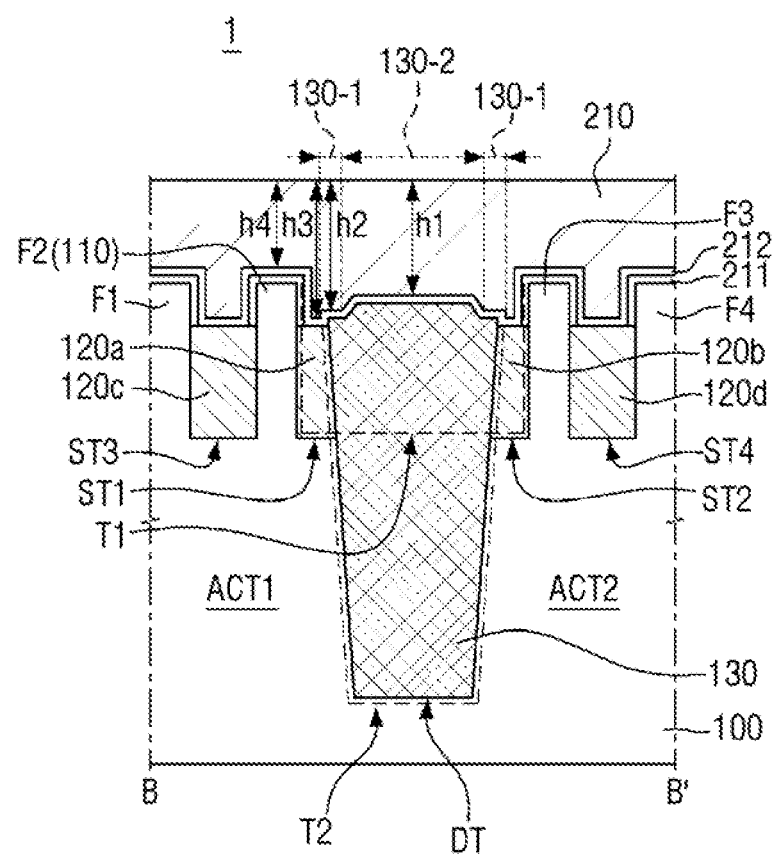
FIG. 3 is a cross sectional view taken along line B-B' of FIG. 1.
Figure 4:
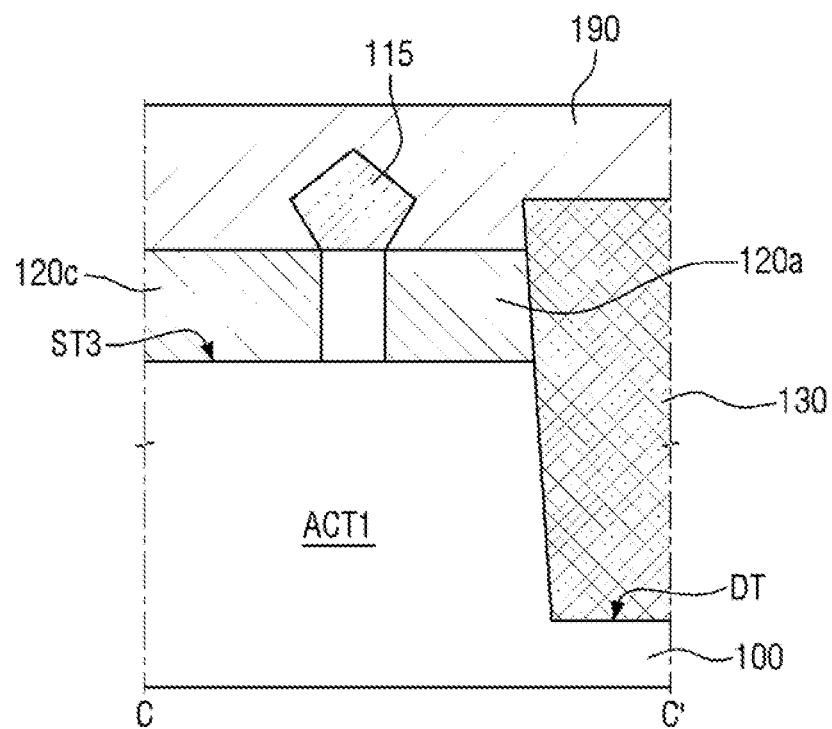
FIG. 4 is a cross sectional view taken along line C-C' of FIG. 1.

FIG. 1 is a layout diagram of a semiconductor device 1 according to an exemplary embodiment, and FIG. 2 is a cross sectional view taken along line A-A' of FIG. 1. FIG. 3 is a cross sectional view taken along line B-B' of FIG. 1, and FIG. 4 is a cross sectional view taken along line C-C' of FIG. 1.

Referring to FIGS. 1 to 4, the semiconductor device 1 may include a first to a fourth fin-type patterns F1-F4, a first to a fourth shallow trenches ST1-ST4, a deep trench DT, a first field insulating film 120, a second field insulating film 130 and a first gate electrode 210.

The first to the fourth fin-type patterns F1-F4 may extend in a first direction X1, respectively. The first to the fourth fin-type patterns F1-F4 may be spaced from each other in a second direction Y1. The third shallow trench ST3 may be formed between the first fin-type pattern F1 and the second fin-type pattern F2 (or 110). The first shallow trench ST1, the second shallow trench ST2 and the deep trench DT may be formed between the second fin-type pattern F2 (or 110) and the third fin-type pattern F3. The fourth shallow trench ST4 may be formed between the third fin-type pattern F3 and the fourth fin-type pattern F4.

The first fin-type pattern F1 and the second fin-type pattern F2 (or 110) may be formed in a first active region ACT1 of a substrate 100. The third fin-type pattern F3 and the fourth fin-type pattern F4 may be formed in a second active region ACT2 of the substrate 100.

As illustrated in FIG. 1, dual fin structures having the deep trench DT in the middle may be provided, although exemplary embodiments are not limited thereto. Accordingly, single fin structures may be formed on both sides of the deep trench DT, or only one side may be the single fin structure. Further, a multi fin structure having a plurality of fins may be formed instead of the dual fin structure.

The substrate 100 may be a silicon substrate, a bulk silicon or a silicon-on-insulator (SOI), for example. In an exemplary embodiment, the substrate 100 may include a semiconductor material such as germanium, or a compound semiconductor material such as a IV-IV group compound semiconductor or a III-V group compound semiconductor, for example. In an exemplary embodiment, the substrate 100 may be a base substrate having an epitaxial layer formed thereon.

In an exemplary embodiment, the IV-IV group compound semiconductor may be a binary compound or a ternary compound including at least two or more of carbon (C), silicon (Si), germanium (Ge), and tin (Sn). In an exemplary embodiment, the IV-IV group compound semiconductor of the binary or the ternary compound may be doped with a IV group element.

In an exemplary embodiment, the III-V group compound semiconductor may be a binary compound, a ternary compound and a quaternary compound which may include a III group element including aluminum (Al), gallium (Ga), or indium (In) and a V group element including phosphorus (P), arsenic (As) or antimony (Sb).

For the convenience of a description, it is assumed that the first to the fourth fin-type patterns F1-F4 are silicon fin-type active patterns which include silicon.

As illustrated in FIG. 1, the first to the fourth fin-type patterns F1-F4 may be in a rectangular shape, but the present inventive concept is not limited thereto. The first to the fourth fin-type patterns F1-F4 in the rectangular shape may include a long side extended in the first direction X1 and a short side extended in the second direction Y1.

The second fin-type pattern 110 may include a first portion 110-1 and a second portion 110-2. The second portion 110-2 of the second fin-type pattern may be disposed on both sides of the first portion 110-1 of the second fin-type pattern in the first direction X1.

The second fin-type pattern 110 may include, on both sides, a first side surface and a second side surface opposed to each other in the second direction Y1. The first shallow trench ST1 may be in contact with the first side surface, and the third shallow trench ST3 may be in contact with the second side surface. For example, the second fin-type pattern 110 may be defined by the first shallow trench ST1 and the third shallow trench ST3.

The first shallow trench ST1 may be formed to be in contact with the first side surface of the second fin-type pattern 110. For example, a bottom surface of the first shallow trench ST1 may be an upper surface of the substrate 100, and one side surface of the first shallow trench ST1 may be the first side surface of the second fin-type pattern 110. A first portion 120a of the first field insulating film may be formed in the first shallow trench ST1. A third portion 120c of the first field insulating film may be formed in the third shallow trench ST3.

The third shallow trench ST3 may be formed to be in contact with the second side surface of the second fin-type pattern 110. For example, a bottom surface of the third shallow trench ST3 may be the upper surface of the substrate 100, and one side surface of the third shallow trench ST3 may be the second side surface of the second fin-type pattern 110. Further, the other side surface of the third shallow trench ST3 may be the one side surface of the first fin-type pattern F1.

The first shallow trench ST1 may be in contact with the second fin-type pattern 110 and may also contact the deep trench DT. That is, the first shallow trench ST1 may contact the deep trench DT at a side opposite to the side contacting the second fin-type pattern 110.

The third fin-type pattern F3 may include, on both sides, a first side surface and a second side surface opposed to each other in the second direction Y1. The first side surface of the third fin-type pattern F3 may face the first side surface of the second fin-type pattern F2 (or 110). The second shallow trench ST2 may be in contact with the first side surface of the third fin-type pattern F3, and the fourth shallow trench ST4 may be in contact with the second side surface of the third fin-type pattern F3. For example, the third fin-type pattern F3 may be defined by the second shallow trench ST2 and the fourth shallow trench ST4.

The second shallow trench ST2 may be formed to be in contact with the first side surface of the third fin-type pattern F3. For example, a bottom surface of the second shallow trench ST2 may be the upper surface of the substrate 100, and one side surface of the second shallow trench ST2 may be the first side surface of the third fin-type pattern F3. A second portion 120b of the first field insulating film may be formed in the second shallow trench ST2. A fourth portion 120d of the first field insulating film may be formed in the fourth shallow trench ST4.

The fourth shallow trench ST4 may be formed to be in contact with the second side surface of the third fin-type pattern F3. For example, a bottom surface of the fourth shallow trench ST4 may be the upper surface of the substrate 100, and one side surface of the fourth shallow trench ST4 may be the second side surface of the third fin-type pattern F3. Further, the other side surface of the fourth shallow trench ST4 may be one side surface of the fourth fin-type pattern F4.

The second shallow trench ST2 may be in contact with the third fin-type pattern F3 and may also be in contact with the deep trench DT. For example, the second shallow trench ST2 may be in contact with the deep trench DT at a side opposite to the side contacting the third fin-type pattern F3. For example, the first shallow trench ST1 and the second shallow trench ST2 may be formed on both sides of the deep trench DT.

The deep trench DT may be in contact with the first shallow trench ST1 and the second shallow trench ST2. The bottom surface of the deep trench DT may be connected with the bottom surfaces of the first shallow trench ST1 and the second shallow trench ST2. The bottom surfaces of the first shallow trench ST1 and the second shallow trench ST2 may each be higher than the bottom surface of the deep trench DT. Accordingly, stepped portions may be formed between the bottom surface of the deep trench DT, and the bottom surfaces of the first shallow trench ST1 and the second shallow trench ST2.

Accordingly, the first shallow trench ST1 and the third shallow trench ST3 may define the second fin-type pattern 110, and the second shallow trench ST2 and the fourth shallow trench ST4 may define the third fin-type pattern F3. The deep trench DT may define the first active region ACT1 and the second active region ACT2. For example, the first active region ACT1 and the second active region ACT2 may be divided from each other with reference to the deep trench DT. A second field insulating film 130 may be formed in the deep trench DT.

A first trench T1 may be defined by the first side surface of the second fin-type pattern F2 (or 110) and the first side surface of the third fin-type pattern F3. The first field insulating film 120 may be formed in the first trench T1. Further, a second trench T2 may penetrate the first trench T1 so that a bottom surface of the second trench T2 is lower than a bottom surface of the first trench T1. The second trench T2 may be filled with the second field insulating film 130. Accordingly, the first trench T1 may be filled with the first field insulating film 120 and the second field insulating film 130. At this time, the first field insulating film 120 may contact an inner side surface of the first trench T1 in the second direction Y1, but may not contact the second field insulating film 130. The first field insulating film 120 may contact both sides of the second field insulating film 130.

The first field insulating film 120 may be formed on the substrate 100, and disposed around the first to the fourth fin-type patterns F1-F4. The first field insulating film 120 is formed so as to partially surround the first to the fourth fin-type patterns F1-F4, and a portion of the first to the fourth fin-type patterns F1-F4 may protrude upward higher than an upper surface of the first field insulating film 120. For example, the first field insulating film 120 may partially fill the first to the fourth shallow trenches ST1-ST4.

For example, the first field insulating film 120 may be an oxide layer, a nitride layer, an oxynitride layer or a multi-layer combining thereof. Further, the first field insulating film 120 may include poly silazene (PSZ), undoped silica glass (USG) or high-density plasma deposition (HDP) oxide. The present inventive concept is not limited thereto.

The second field insulating film 130 may be formed on the substrate 100 and disposed in the deep trench DT. A portion of the first to the fourth fin-type patterns F1-F4 may protrude upward higher than the upper surface of the second field insulating film 130. For example, the upper surface of the second field insulating film 130 may be formed lower than the upper surfaces of the first to the fourth fin-type patterns F1-F4.

The second field insulating film 130 may include a first region 130-1 and a second region 130-2. The first region 130-1 may be in contact with the first field insulating film 120. The first region 130-1 may be located between the first field insulating film 120 and the second region 130-2. The first region 130-1, together with the second region 130-2, may fill the deep trench DT.

The second region 130-2 may be formed at a farther distance from the second fin-type pattern F2 (or 110) and the third fin-type pattern F3, than the first region 130-1 is. The second region 130-2 may be in an integrated structure with the first region 130-1. The second region 130-2, together with the first region 130-1, may fill the deep trench DT.

For example, the second field insulating film 130 may be an oxide layer, a nitride layer, an oxynitride layer or a multi-layer combining thereof. In an exemplary embodiment, the second field insulating film 130 may include, for example, silicon oxide, silicon nitride, silicon oxynitride, or a low-k dielectric material with a smaller dielectric constant than silicon oxide. For example, the low-k dielectric material may include flowable oxide (FOX), Tonen silazene (TOSZ), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but the present inventive concept is not limited thereto.

An upper surface of the first region 130-1 of the second field insulating film 130 may be lower than an upper surface of the second region 130-2. The upper surface of the first region 130-1 of the second field insulating film 130 may be higher than the upper surface of the first field insulating film 120. For example, the upper surface of the second region 130-2 of the second field insulating film 130 may be higher than the upper surface of the first field insulating film 120. The heights of the upper surfaces of the first region 130-1 and the second region 130-2 of the second field insulating film 130 may be lower than the heights of the first to the fourth fin-type patterns F1-F4.

A lower surface of the first portion 120a of the first field insulating film may be in contact with the bottom surface of the first shallow trench ST2, and the lower surface of the second field insulating film 130 may be in contact with the bottom surface of the deep trench DT. Accordingly, the lower surface of the first field insulating film 120 may be higher than the lower surface of the second field insulating film 130.

The first gate electrode 210 may be formed to extend in the second direction Y1 and intersect the first to the fourth fin-type patterns F1-F4. The first gate electrode 210 may be disposed on the first to the fourth fin-type patterns F1-F4, and on the first field insulating film 120 and the second field insulating film 130. The first gate electrode 210 may be formed on the first portion 110-1 of the second fin-type pattern.

The first gate electrode 210 may be formed on the first to the fourth fin-type patterns F1-F4, and on the first field insulating film 120 and the second field insulating film 130. The first gate electrode 210 may be formed to partially surround the side surfaces of the first to the fourth fin-type patterns F1-F4 and surround the upper surfaces of the first to the fourth fin-type patterns F1-F4. The bottom surface of the first gate electrode 210 may be formed along the profile of the first to the fourth fin-type patterns F1-F4, the first field insulating film 120 and the second field insulating film 130, i.e., formed along the profile of the upper surfaces of the first and the second field insulating films 120 and 130.

The first gate electrode 210 may have a first thickness h1 at a portion overlapping the second region 130-2 of the second field insulating film 130. The first gate electrode 210 may have a second thickness h2 at a portion overlapping the first region 130-1 of the second field insulating film 130. The first gate electrode 210 may have a third thickness h3 at a portion overlapping the first field insulating film 120. The first gate electrode 210 may have a fourth thickness h4 at a portion overlapping the second fin-type pattern F2 (or 110).

As illustrated, the first thickness h1 is smaller than the second thickness h2, and the second thickness h2 is smaller than the third thickness h3. Further, the fourth thickness h4 is smaller than the first thickness h1.

The upper surface of the first gate electrode 210 may be formed to be coplanar by a chemical-mechanical planarization (CMP) process. Accordingly, the thickness of the first gate electrode 210 may have different thickness along the second direction Y1 according to the profile of the lower surface of the first gate electrode 210.

The fourth thickness h4 of the first gate electrode 210 may be smaller than the first thickness h1, the second thickness h2 and the third thickness h3, because the height of the upper surface of the second fin-type pattern 110 is greater than the heights of the upper surfaces of the first field insulating film 120 and the second field insulating film 130.

The first thickness h1 of the first gate electrode 210 may be smaller than the second thickness h2 and the third thickness h3, because the upper surface of the second region 130-2 of the second field insulating film 130 is higher than the upper surface of the first region 130-1 of the second field insulating film 130 and higher than the upper surface of the first field insulating film 120.

Gate insulating films 211 and 212 may be formed between the first to the fourth fin-type patterns F1-F4 and the first gate electrode 210. The gate insulating films 211 and 212 may include an interfacial layer 211 and a high-k dielectric insulating film 212.

The interfacial layer 211 may be formed by partially oxidizing the first fin-type pattern 110. The interfacial layer 211 may be formed along the profile of the first fin-type pattern 110 protruding upward higher than the upper surfaces of the first and the second field insulating films 120 and 130. In an exemplary embodiment, the first fin-type pattern 110 is a silicon fin-type pattern including silicon, and the interfacial layer 211 may include a silicon oxide layer.

In an exemplary embodiment, the interfacial layer 211 may be formed along the upper surfaces of the first and the second field insulating films 120 and 130. In an exemplary embodiment, the interfacial layer 211 may be formed along the upper surfaces of the first and the second field insulating films 120 and 130 according to a method of forming the interfacial layer 211. For example, the interfacial layer 211 may be conformally formed by a deposition process such as a chemical vapor deposition (CVD) process.

Further, even in an example where the first and the second field insulating films 120, 130 include silicon oxide, the interfacial layer 211 may be formed along the upper surfaces of the first and the second field insulating films 105, 106, if there is difference in the physical properties between the silicon oxide included in the first and the second field insulating films 120, 130 and the silicon oxide layer included in the interfacial layer 211.

The high-k dielectric insulating film 212 may be formed between the interfacial layer 211 and the first gate electrode 210. The high-k dielectric insulating film 212 may be formed along the profile of the first fin-type pattern 110 protruding upward higher than the upper surfaces of the first and the second field insulating films 120 and 130. Further, the high-k dielectric insulating film 212 may be formed between the first gate electrode 210, and the first field insulating film 120 and the second field insulating film 130.

For example, the high-k dielectric insulating film 212 may include silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, and the present inventive concept is not limited thereto.

A gate spacer 215 may be disposed on a sidewall of the first gate electrode 210 extending in the second direction Y1. The gate spacer 215 may include, for example, silicon nitride (SiN), silicon oxynitride (SiON), silicon oxide (SiO$_2$), silicon oxycarbonitride (SiOCN), or a combination thereof.

The source/drain 115 may be formed on both sides of the first gate electrode 210, and on the first fin-type pattern 110.

For example, the source/drain 115 may be formed on the second portion 110-2 of the first fin-type pattern.

The source/drain 115 may be formed of an epitaxial layer formed by epitaxy. In an exemplary embodiment, the source/drain 115 may be an elevated source/drain. The epitaxial layer 115e may fill a recess 110r formed in the second portion 110-2 of the first fin-type pattern.

An outer circumference of the epitaxial layer 115e may have a variety of shapes. For example, the shape of the outer circumference of the epitaxial layer 115e may have diamond, circle or rectangle. FIG. 4 illustrates a diamond shape (or pentagon or hexagon shape), for an example.

In an exemplary embodiment, the semiconductor device 1 may be a P-type Metal-Oxide-Semiconductor (PMOS) transistor, and the source/drain may include a compressive stress material. For example, the compressive stress material may be SiGe which has a higher lattice constant compared to Si. For example, the compressive stress material may increase mobility of the carrier in the channel region by exerting compressive stress on the first fin-type pattern 110.

In an exemplary embodiment, the semiconductor device 1 may be an N-type Metal-Oxide-Semiconductor (NMOS) transistor, and the source/drain 115 may include a tensile stress material. For example, the first fin-type pattern 110 is silicon, and the tensile stress material may include SiC which has a smaller lattice constant than the silicon. For example, the tensile stress material may increase mobility of the carrier in the channel region by exerting tensile stress on the first fin-type pattern 110.

An interlayer insulating film 190 may cover the first fin-type pattern 110, the source/drain 115 and the first gate electrode 210. The interlayer insulating film 190 may be formed on the first and the second field insulating films 120 and 130.

For example, the interlayer insulating film 190 may include silicon oxide, silicon nitride, silicon oxynitride, or a low-k dielectric material with a smaller dielectric constant than silicon oxide. For example, the low-k dielectric material may include flowable oxide (FOX), Tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but the present inventive concept is not limited thereto.

The material of the first field insulating film 120 may have a higher etch rate than the material of the second field insulating film 130. In this case, a simultaneous etching process performed on the first field insulating film 120 and the second field insulating film 130 may form different heights of the first field insulating film 120 and the second field insulating film 130. For example, the second field insulating film 130 may be formed with a higher upper surface than that of the first field insulating film 120.

As the heights of the upper surfaces of the first field insulating film 120 and the second field insulating film 130 increase, the lower surface of the first gate electrode 210 may have a relatively increased height. That is, as the thickness or the volume of the first gate electrode 210 decreases, the effective capacitance thereof will decrease, thus further enhancing AC performance and reliability of the semiconductor device 1. That is, the first gate electrode 210 and the source/drain 115 can have enhanced AC performances.

Hereinbelow, a semiconductor device 2 according to an exemplary embodiment will be explained with reference to FIGS. 1 and 5. The description of those described above with respect to the semiconductor device 1 will omitted or be made as brief as possible.

Figure 5:
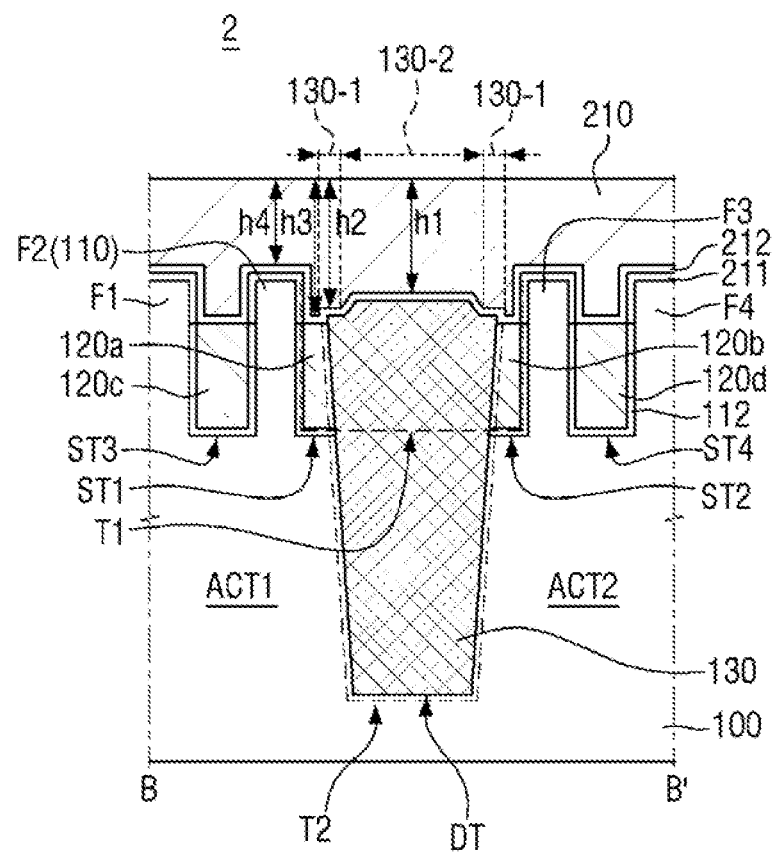
FIG. 5 is a cross sectional view of a semiconductor device according to an exemplary embodiment of the present inventive concept.

FIG. 5 is a cross sectional view of a semiconductor device according to an exemplary embodiment. FIG. 5 is a cross sectional view taken along line B-B' of FIG. 1.

Referring to FIG. 5, the semiconductor device 2 may include a liner 112.

The liner 112 may be formed within the first to the fourth shallow trenches ST1-ST4. The liner 112 may be formed conformally along the bottom surfaces and the side surfaces of the first to the fourth shallow trenches ST1-ST4. In an exemplary embodiment, the liner 112 may be formed only partially on the side surfaces of the first to the fourth shallow trenches ST1-ST4. The first field insulating film 120 may partially fill the first to the fourth shallow trenches ST1-ST4, and the liner 112 may be formed between the first field insulating film 120 and the substrate 100. The liner 112 need not be formed on the side surfaces of the first to the fourth fin-type patterns F1-F4 which protrude farther than the first field insulating film 120.

Hereinbelow, a semiconductor device 3 according to an exemplary embodiment will be explained with reference to FIGS. 1, 6 and 7. The descriptions of those described above with reference to the semiconductor devices 1 and 2 will be omitted or will be made as brief as possible.

Figure 6:
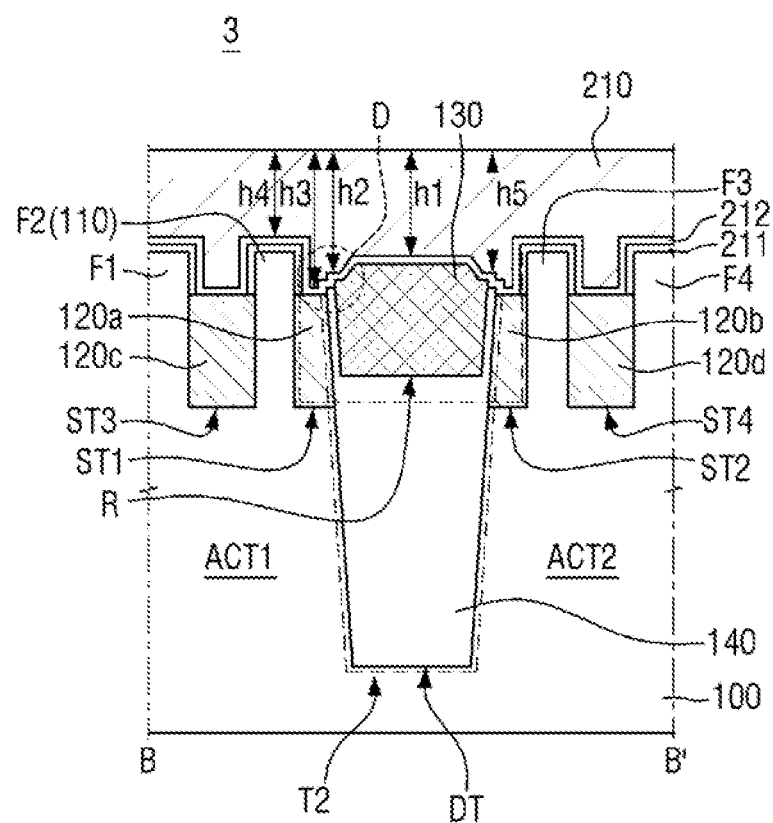
FIGS. 6 and 7 are cross sectional views of a semiconductor device according to an exemplary embodiment of the present inventive concept.
Figure 7:
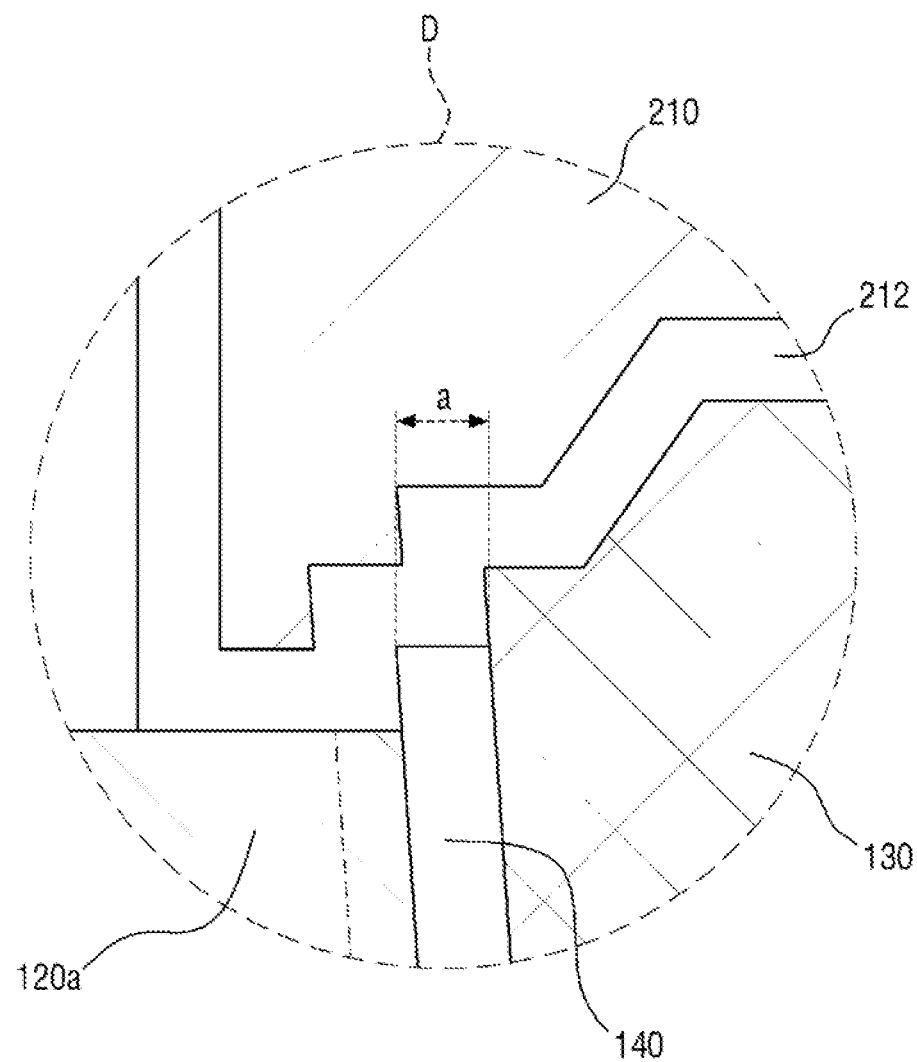

FIGS. 6 and 7 are cross sectional views of a semiconductor device according to an exemplary embodiment. FIG. 6 is a cross sectional view taken along line B-B' of FIG. 1, and FIG. 7 is an expanded view of the encircled area D of FIG. 6.

Referring to FIGS. 6 and 7, the semiconductor device 3 may include a second field insulating film 130 and a third field insulating film 140.

The third field insulating film 140 may partially fill the deep trench DT. The third field insulating film 140 may be in contact with the bottom surface and the side surface of the deep trench DT. The third field insulating film 140 may be formed conformally on the bottom surface and the side surface of the deep trench DT.

The third field insulating film 140 may include a recess R. The recess R may be formed on the third field insulating film 140. A side surface of the recess R may be the third field insulating film 140, and a bottom surface of the recess R may also be the third field insulating film.

The second field insulating film 130 may fill the recess R. The second field insulating film 130 and the first field insulating film 120 may be spaced apart from each other. The third field insulating film 140 may be formed between the second field insulating film 130 and the first field insulating film 120.

The uppermost portion of the upper surface of the third field insulating film 140 may be higher than the upper surface of the first field insulating film 120 and lower than the upper surface of the second field insulating film 130. The etch rate of the material of the third field insulating film 140 may be higher than the etch rate of the second field insulating film 130. The etch rate of the material of the third field insulating film 140 may be equal to or lower than the etching rate of the first field insulating film 120.

The third field insulating film 140 may include the same material as the first field insulating film 120. For example, the third field insulating film 140 may include poly silazene (PSZ), undoped silica glass (USG) or high-density plasma deposition (HDP) oxide, and the present inventive concept is not limited thereto.

The first gate electrode 210 may have a fifth thickness h5 at a portion overlapping the third field insulating film 140. The fifth thickness h5 may be thicker than the first thickness h1, the second thickness h2 and the fourth thickness h4. The fifth thickness h5 may be thinner than the third thickness h3. This is attributable to the relationship between the height of the upper surface of the third field insulating film 140, and the heights of the upper surfaces of the second fin-type pattern F2 (or 110), the first field insulating film 120 and the second field insulating film 130.

As illustrated in FIG. 6, the bottom surface of the recess R may be formed higher than the bottom surfaces of the first shallow trench ST1 and the second shallow trench ST2. The present inventive concept is not limited thereto. The depth of the recess R may be set such that the second field insulating film 130 may fill the recess R completely without forming an air gap between the second field insulating film 130 and the third field insulating film 140. For example, the depth of the recess R may vary according to the gap filling capability of the second field insulating film 130.

The second field insulating film 130 may have less gap filling capability compared to the first field insulating film 120. If the deep trench DT is formed with the second field insulating film 130 only, an air gap may be formed in the deep trench DT, and thus the performance and reliability of the semiconductor device 3 may be reduced. Accordingly, the third field insulating film 140 may be first formed in the deep trench DT, and then the second field insulating film 130 may fill up the remaining space of the deep trench DT.

In this manner, the third field insulating film 140 may completely fill up the inner space of the deep trench DT, and the second field insulating film 130 may have an upper surface formed high such that the thickness of the first gate electrode 210 is reduced. The capacitance between the gate electrode and the source/drain may be reduced and the interior of the deep trench DT may be filled without generating an air gap.

The uppermost portion of the upper surface of the third field insulating film 140, i.e., the upper surface of the third field insulating film 140 which is exposed, i.e., not covered by the second field insulating film 130 may have a predetermined width 'a' in the second direction Y1. If the third field insulating film 140 has a width greater than the width 'a', the area of the second field insulating film 130 may decrease, and thus the capacitance reduction effect of the increased height of the upper surface of the second field insulating film 130 may decrease. If the third field insulating film 140 has a width smaller than the width 'a', an air gap may be formed between the second field insulating film 130 and the third field insulating film 140. For example, the first gate electrode 210 or the gate insulating films 211 and 212 need not be formed conformally. Accordingly, the predetermined width 'a' may be set so that the recess R may be completely filled without reducing the capacitance reduction effect. For example, the width 'a' may be less than about 30 nm.

Hereinbelow, a semiconductor device 4 according to an exemplary embodiment will be explained with reference to FIGS. 1 and 8. The descriptions of those described above with reference to the semiconductor devices 1-3 will be omitted or will be made as brief as possible.

Figure 8:
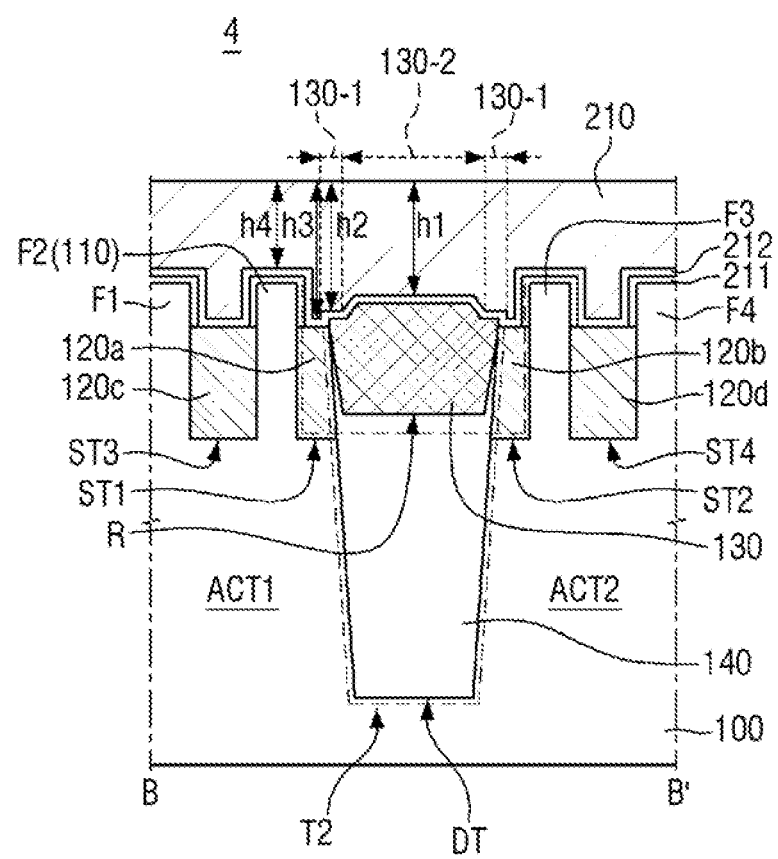
FIG. 8 is a cross sectional view of a semiconductor device according to an exemplary embodiment of the present inventive concept.

FIG. 8 is a cross sectional view of a semiconductor device 4 according to an exemplary embodiment. FIG. 8 is a cross sectional view taken along line B-B' of FIG. 1.

Referring to FIG. 8, the semiconductor device 4 may include a third field insulating film 140 disposed in a recess R, an upper sidewall of the third field insulating film 140 is in contact with the first field insulating film and a lower sidewall of the third field insulating film 140 is spaced apart from the first field insulating film 120.

Accordingly, a portion of the side surface of the second field insulating film 130 formed in the recess R may be in contact with the first field insulating film 120, and the rest portion of the side surface of the second field insulating film 130 may be in contact with the third field insulating film 140. The upper surface of the third field insulating film 140 may be fully covered by the second field insulating film 130 and need not be exposed.

In this case, the second field insulating film 130 may be formed to fill the deep trench D between the first portion 120a and the second portion 120b of the first field insulating film. At this time, since the upper surface of the second field insulating film 130 is formed higher than the upper surface of first field insulating film 120, the capacitance of the first gate electrode 210 may be reduced and the AC performance of the semiconductor device 4 may be enhanced.

Further, since the upper surface of the third field insulating film 140 is fully covered by the second field insulating film 130, generation of an air gap may be prevented in the subsequent process between the third field insulating film 140 and the first gate electrode 210. Accordingly, the semiconductor device 4 can have increased performance.

Hereinbelow, a semiconductor device 5 according to an exemplary embodiment will be explained with reference to FIGS. 1 and 9. The descriptions of those described above with reference to the semiconductor devices 1-4 will be omitted or will be made as brief as possible.

Figure 9:
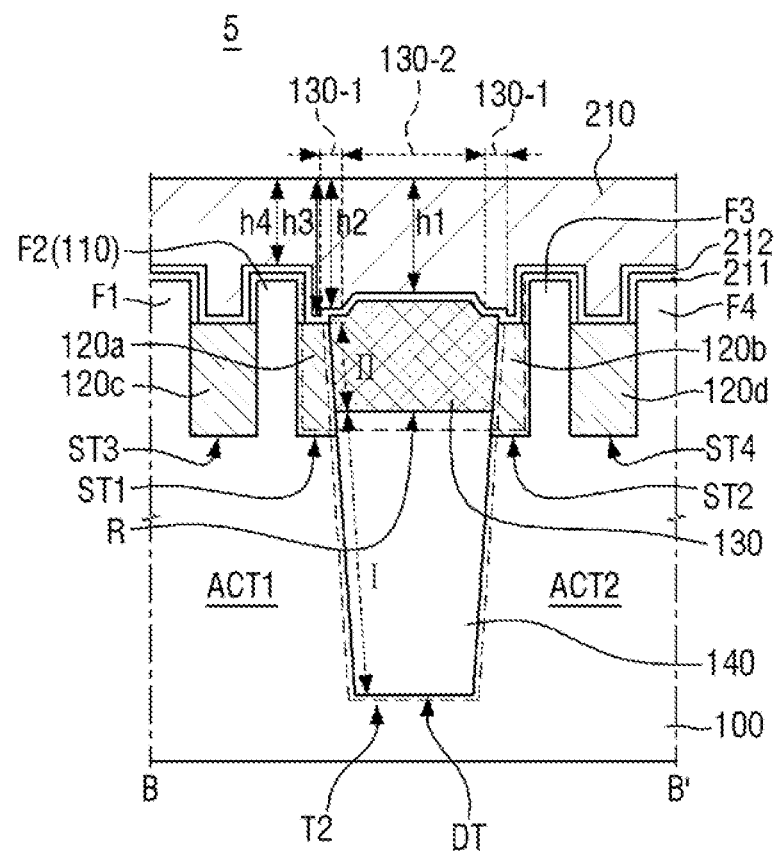
FIG. 9 is a cross sectional view of a semiconductor device according to an exemplary embodiment of the present inventive concept.

FIG. 9 is a cross sectional view of the semiconductor device 5 according to an exemplary embodiment. FIG. 9 is a cross sectional view taken along line B-B' of FIG. 1.

Referring to FIG. 9, the semiconductor device 5 may include a recess R of which sidewall is in contact with a first field insulating film 120.

The side surface of a second field insulating film 130 formed in the recess R may be in contact with the first field insulating film 120. The upper surface of a third field insulating film 140 may be fully covered by the second field insulating film 130 and need not be exposed.

The sidewall of a deep trench DT may include a first region I and a second region II. The first region I may be in contact with the second field insulating film 130, and the second region II may be in contact with the third field insulating film 140. The first region I may be located on the second region II.

The second field insulating film 130 may fill the first region I of the deep trench DT disposed between the first portion 120a and the second portion 120b of the first field insulating film. The upper surface of the second field insulating film 130 is formed high, and the capacitance of the first gate electrode 210 may be reduced and the AC performance of the semiconductor device 5 may be increased.

Further, since the upper surface of the third field insulating film 140 is fully covered by the second field insulating film 130, generation of an air gap may be prevented in the subsequent process. Accordingly, the semiconductor device 5 may have increased performance.

Hereinbelow, a semiconductor device 6 according to an exemplary embodiment will be explained with reference to FIGS. 1 and 10. The descriptions of those described above with reference to FIGS. 1 and 10 will be omitted or will be made as brief as possible.

Figure 10:
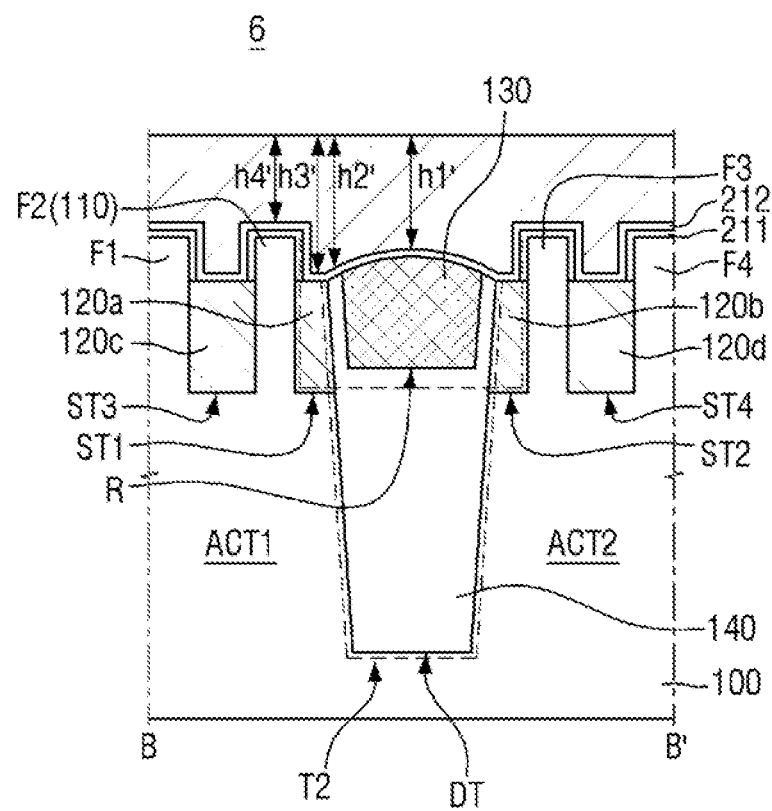
FIG. 10 is a cross sectional view of a semiconductor device according to an exemplary embodiment of the present inventive concept.

FIG. 10 is a cross sectional view of the semiconductor device 6 according to an exemplary embodiment. FIG. 10 is a cross sectional view taken along line B-B' of FIG. 1.

Referring to FIG. 10, the semiconductor device 6 may include a curved upper surface formed by an upper surface of a second field insulating film 130 and an upper surface of a third field insulating film 140.

The upper surface of the first field insulating film 120 may be lower than the upper surface of the third field insulating film 140. The upper surface of the first field insulating film 120 may be in a bowl shape. For example, the upper surface of the first field insulating film 120 may include a portion that is lower than a contacting portion between the upper surface of the first field insulating film 120 and the second fin-type pattern F2 (or 110).

The uppermost portion of the upper surface of the third field insulating film 140 may be higher than the upper surface of the first field insulating film 120 and lower than the upper surface of the second field insulating film 130. The uppermost portion of the third field insulating film 140 may be located on the exposed upper surface of the third field insulating film 140. For example, the upper surface that is not covered by the second field insulating film 130 may include the uppermost portion of the upper surface of the third field insulating film 140. The exposed, upper surface of the third field insulating film 140 may be higher than the upper surface of the first field insulating film 120 and lower than the upper surface of the second field insulating film 130.

The second field insulating film 130 may be in a convex shape. The uppermost portion of the upper surface of the second field insulating film 130 may be formed higher than the height of a portion at which the second field insulating film 130 and the third field insulating film 140 meet. As illustrated, there may be two portions at which the second field insulating film 130 and the third field insulating film 140 meet in the second direction Y1, and the uppermost portion of the second field insulating film 130 may be located between these two portions.

Figure 11:
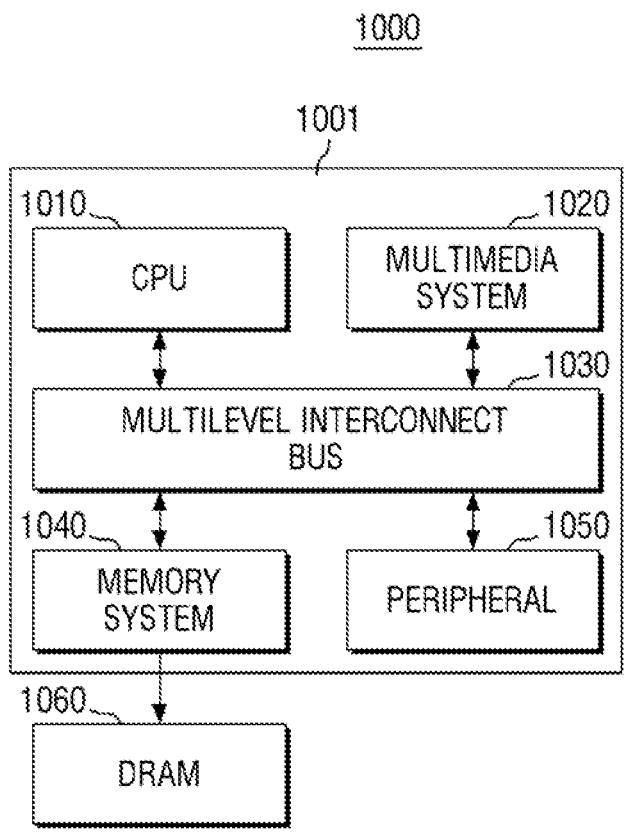
FIG. 11 is a block diagram of a system-on-a-chip (SoC) system comprising a semiconductor device according to an exemplary embodiment of the present inventive concept.

FIG. 11 is a block diagram of an SoC system 1000 comprising a semiconductor device according to an exemplary embodiment.

Referring to FIG. 11, the SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform an arithmetic operation necessary for the driving of the SoC system 1000. In an exemplary embodiment, the CPU 1010 may be configured on a multi-core environment which includes a plurality of cores.

The multimedia system 1020 may be used for performing a variety of multimedia functions on the SoC system 1000. The multimedia system 1020 may include a three-dimensional (3D) engine module, a video codec, a display system, a camera system, or a post-processor.

The bus 1030 may be used for exchanging data communication among the CPU 1010, the multimedia system 1020, the memory system 1040 and the peripheral circuit 1050. In some exemplary embodiments, the bus 1030 may have a multi-layer structure. Specifically, an example of the bus 1030 may be a multi-layer advanced high-performance bus (AHB), or a multi-layer advanced eXtensible interface (AXI), and the present inventive concept is not limited herein.

The memory system 1040 may provide environments necessary for the application processor 1001 to connect to an external memory (e.g., DRAM 1060) and perform high-speed operation. In some exemplary embodiments, the memory system 1040 may also include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some exemplary embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include a semiconductor device according to an exemplary embodiment of the present inventive concept.

Figure 12:
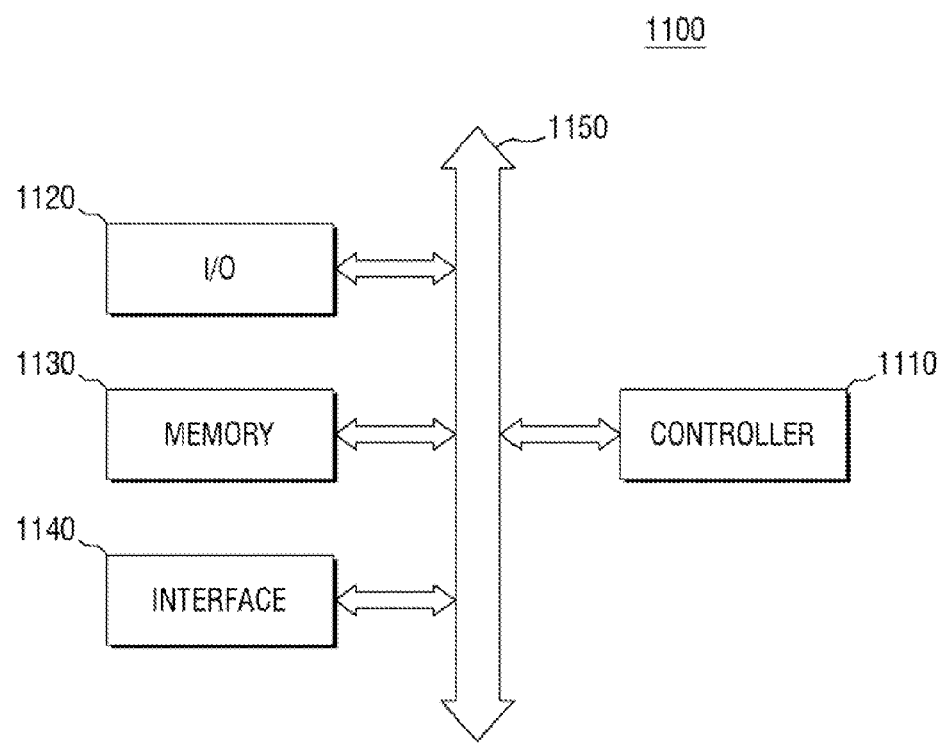
FIG. 12 is a block diagram of an electronic system comprising a semiconductor device according to an exemplary embodiment of the present inventive concept.

FIG. 12 is a block diagram of an electronic system comprising a semiconductor device according to an exemplary embodiment.

Referring to FIG. 12, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal process, micro controller and logic devices capable of performing functions similar to those mentioned above. The I/O device 1120 may include a keypad, a keyboard or a display device. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

A semiconductor device fabricated according to an exemplary embodiment of the present inventive concept may be provided within the memory device 1130, or the controller 1110 or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 13:
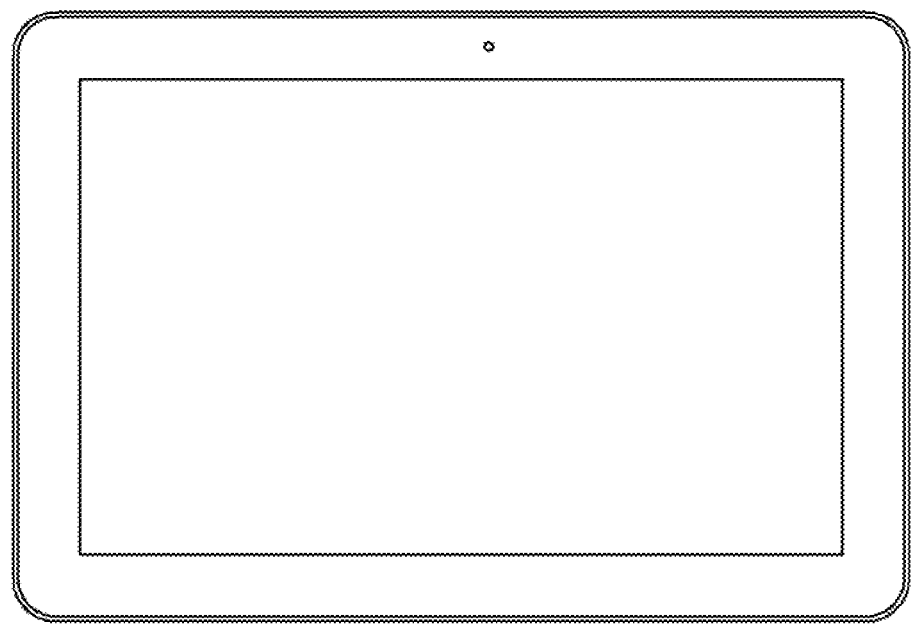
FIGS. 13 to 15 illustrate exemplary semiconductor systems including a semiconductor device according to an exemplary embodiment of the present inventive concept.
Figure 14:
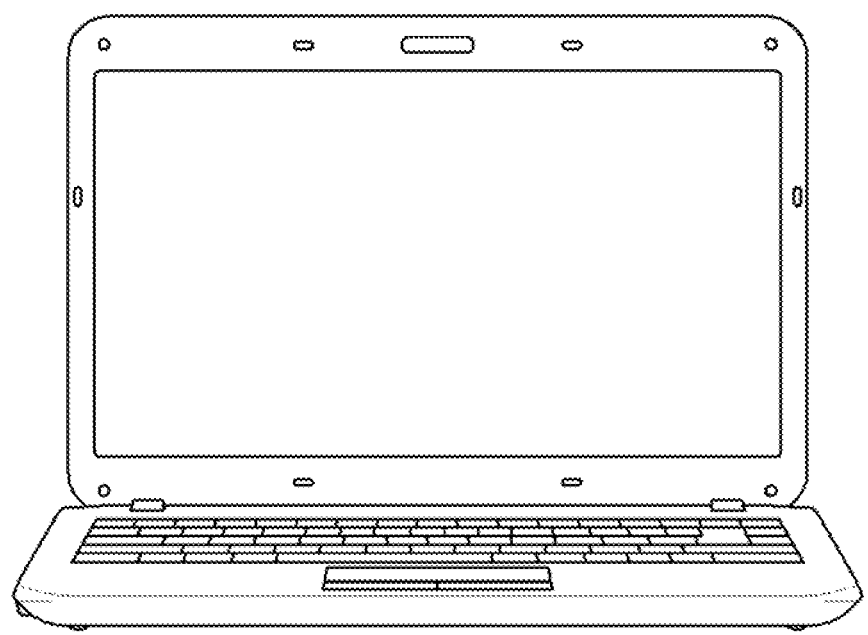
Figure 15:
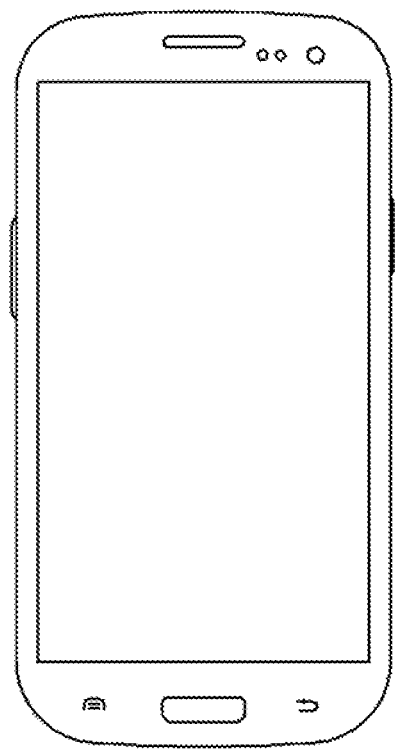

FIGS. 13 to 15 illustrate exemplary semiconductor systems including a semiconductor device according to an exemplary embodiment.

FIG. 13 illustrates a tablet PC 1200, FIG. 14 illustrates a laptop computer 1300, and FIG. 15 illustrates a smartphone 1400. According to the exemplary embodiments explained above, the semiconductor device may be used in these devices, i.e., in the tablet PC 1200, the laptop computer 1300 or the smartphone 1400.

A semiconductor device according to an exemplary embodiment may be applicable to an integrated circuit device not illustrated herein.

For example, an exemplary semiconductor system need not be limited to the tablet PC 1200, the laptop computer 1300 and the smartphone 1400 which are exemplified above.

In an exemplary embodiment, the semiconductor system may include a computer, a ultra mobile PC (UMPC), a workstation, a net-book, personal digital assistants (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, or a digital video player.

Hereinbelow, a method of fabricating a semiconductor device according to an exemplary embodiment will be explained with reference to FIGS. 3 and 16 to 19. FIGS. 16 to 19 are cross sectional views showing a method of fabricating a semiconductor device according to an exemplary embodiment. In the following description, descriptions of those described above with reference to the semiconductor devices 1-6 will be omitted or will be made as brief as possible for the sake of brevity.

Figure 16:
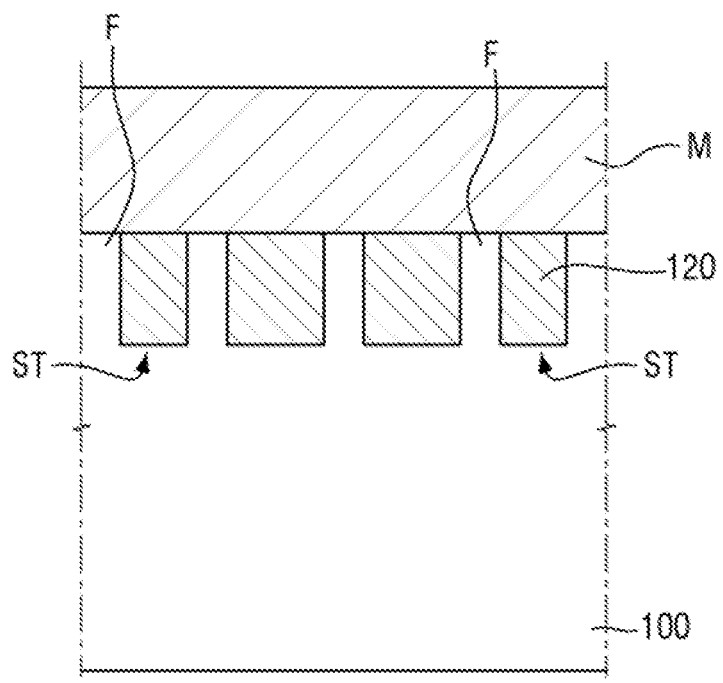
FIGS. 16 to 19 show a method of fabricating a semiconductor device according to an exemplary embodiment of the present inventive concept.

Referring to FIG. 16, a fin-type pattern F and a shallow trench ST are formed on a substrate 100. A plurality of fin-type patterns F and a plurality of shallow trenches ST may be formed. The fin-type pattern F may be defined by the shallow trench ST, and the shallow trench ST may be defined by the fin-type pattern F. For example, a side surface of the fin-type pattern F may be a sidewall of the shallow trench ST. The height of the fin-type pattern F may be substantially the same with the depth of the shallow trench ST. The fin-type patterns F may be spaced apart from each other at a uniform interval. The shallow trenches ST may also be spaced apart from each other at a uniform interval.

A first field insulating film 120 may fill the shallow trench ST. The first field insulating film 120 may completely fill the shallow trench ST. An upper surface of the fin-type pattern F and an upper surface of the first field insulating film 120 may be formed to be coplanar with each other. The term "coplanar surfaces" refers to surfaces being made planar by the planarization process and may include a presence of minute stepped portions.

Next, a mask layer M is formed on the first field insulating film 120 and the fin-type pattern F. The mask layer M may be uniformly formed on the first field insulating film 120 and the fin-type pattern F.

Figure 17:
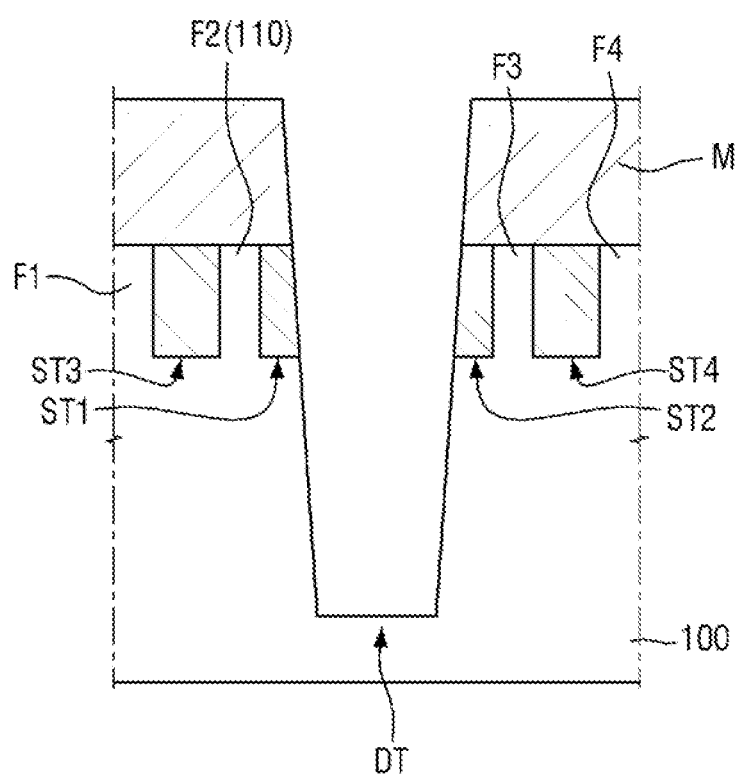

Referring to FIG. 17, a deep trench DT is formed by etching the mask layer M, the fin-type pattern F and the first field insulating film 120.

The deep trench DT may be formed deeper than the shallow trench ST. The fin-type pattern F may be partially removed by the deep trench DT. A portion of the first field insulating film 120 may be completely removed by the deep trench DT, while the rest portion of the first field insulating film 120 may be partially removed. However, the present inventive concept is not limited thereto.

The deep trench DT may include an inclined sidewall as illustrated, having a downwardly decreasing width. However, the present inventive concept is not limited thereto.

Figure 18:
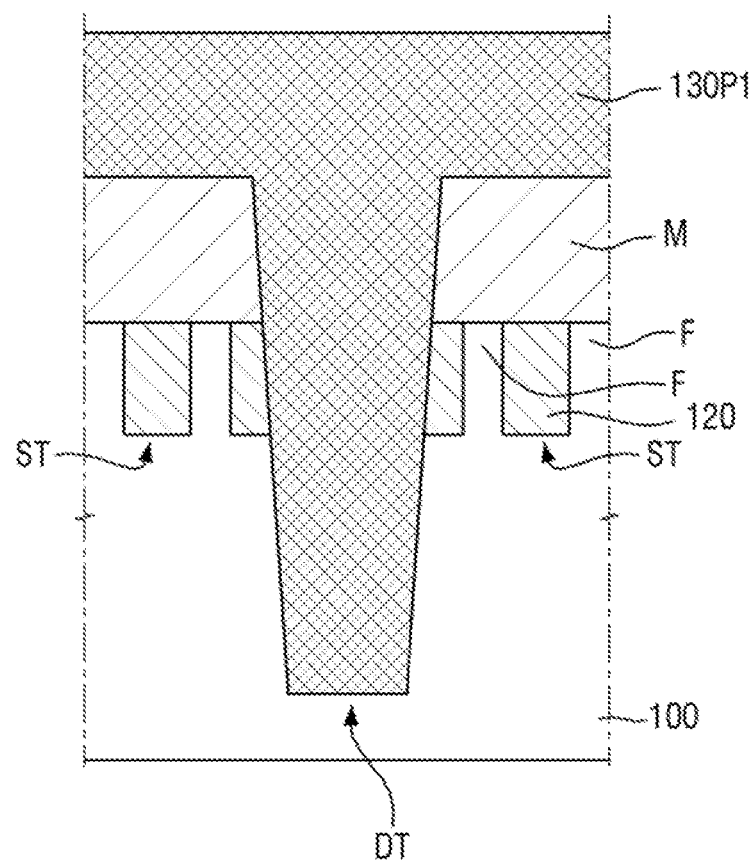

Referring to FIG. 18, a second preliminary field insulating film 130P1 is formed. The second preliminary field insulating film 130P1 may fill the deep trench DT. The second preliminary field insulating film 130P1 may be formed on the mask layer M. The second preliminary field insulating film 130P1 may be etched later to become the second field insulating film 130.

Figure 19:
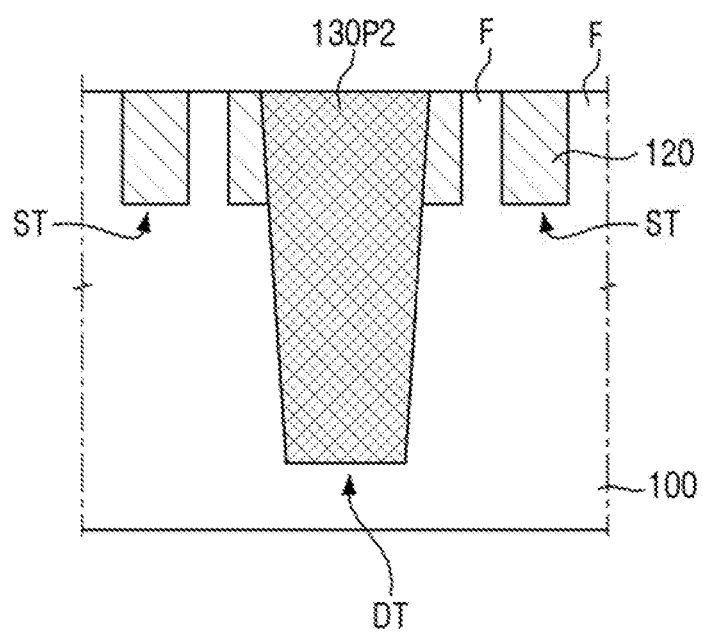

Referring to FIG. 19, a portion of the second preliminary field insulating film 130P1 and the mask layer M are removed. With the partial removal, the second preliminary field insulating film 130P1 may be planarized to be a second planarized field insulating film 130P2.

An upper surface of the second planarized field insulating film 130P2 may be substantially coplanar with the upper surface of the first field insulating film 120 and a upper surface of the fin-type pattern F. The second planarized field insulating film 130P2 may be etched so that the second field insulating film 130 may be formed, as shown in FIG. 3, for example.

Referring back to FIG. 3, the second planarized field insulating film 130P2 and the first field insulating film 120 may be etched to thus form the second field insulating film 130. These etching processes may be performed at the same time. For example, the first field insulating film 120 and the second planarized field insulating film 130P2 may be etched simultaneously. The second planarized field insulating film 130P2 has a lower etch rate compared to the first field insulating film 120. Accordingly, the upper surface of the second field insulating film 130 may be higher than the upper surface of the first field insulating film 120.

The gate insulating films 211 and 212 may then be formed on the first field insulating film 120 and the second field insulating film 130. The first gate electrode 210 may then be formed on the gate insulating films 211, 212. The thickness of the first gate electrode 210 may vary according to a profile of the upper surfaces of the first field insulating film 120 and the second field insulating film 130. Accordingly, the thickness of the first gate electrode 210 may be decreased due to the upper surface of the second field insulating film 130 which is formed higher than the upper surface of the first field insulating film 120. As a result, the parasitic capacitance between the first gate electrode 210 and the source/drain 115, as shown in FIG. 2 for example, may be reduced.

Hereinbelow, a method of fabricating a semiconductor device according to an exemplary embodiment will be explained with reference to FIGS. 1, 2, 6, 16, 17, 20 and 21.

Figure 20:
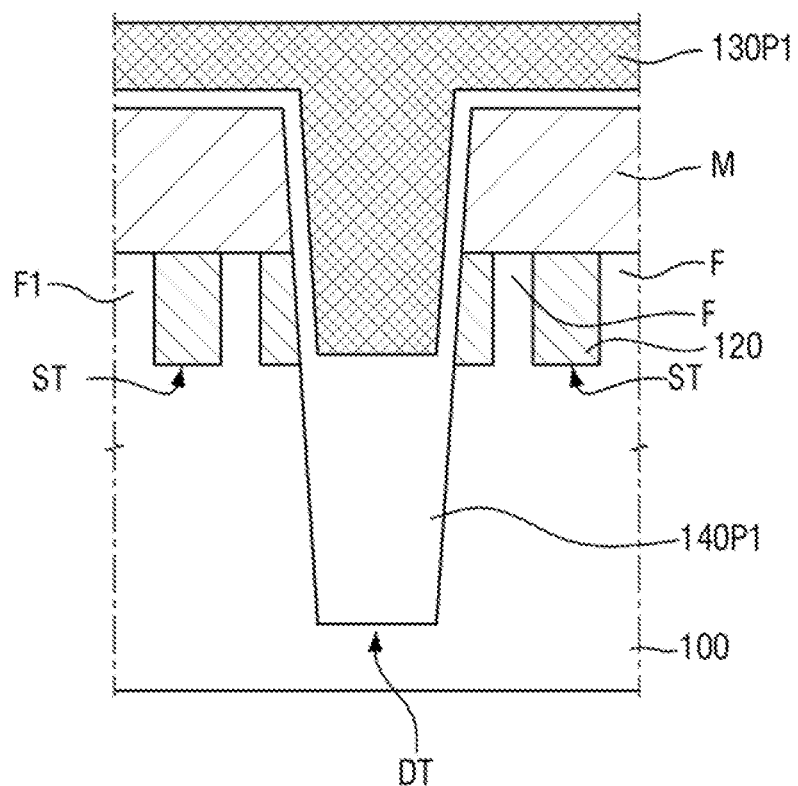
FIGS. 20 and 21 show a method of fabricating a semiconductor device according to an exemplary embodiment of the present inventive concept.
Figure 21:
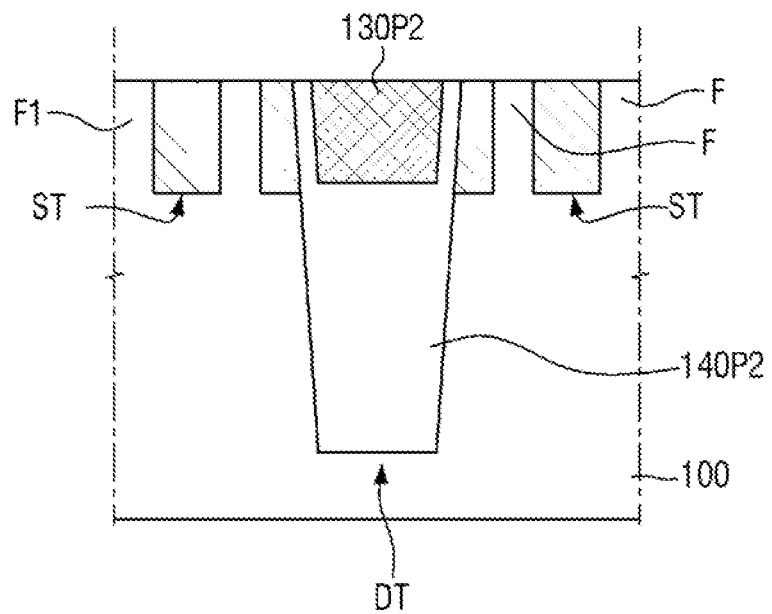

FIGS. 20 and 21 show a method of fabricating a semiconductor device according to an exemplary embodiment. In the following description, descriptions of those described above with reference to the semiconductor devices 1-6 will be omitted or will be made as brief as possible for the sake of brevity.

Referring to FIG. 20, a third preliminary field insulating film 140P1 and a second preliminary field insulating film 130P1 are formed.

The third preliminary field insulating film 140P1 may partially fill the deep trench DT. The third preliminary field insulating film 140P1 may be conformally formed along the side surface and the bottom surface of the deep trench DT. The third preliminary field insulating film 140P1 may have a recess formed on the upper surface. The second preliminary field insulating film 130P1 may be formed in the recess. The third preliminary field insulating film 140P1 may be formed on the mask layer M. The third preliminary field insulating film 140P1 may be etched later to become the third field insulating film 140.

The second preliminary field insulating film 130P1 may completely fill the deep trench DT. For example, the second preliminary field insulating film 130P1 may fill the recess. The second preliminary field insulating film 130P1 may be formed on the third preliminary field insulating film 140P1. The second preliminary field insulating film 130P1 may be etched later to become the second field insulating film 130.

In an exemplary embodiment, the second preliminary field insulating film 130P1 and the third preliminary field insulating film 140P1 are formed of silicon nitride and silicon oxide, respectively.

Referring to FIG. 21, a portion of the second preliminary field insulating film 130P1, a portion of the third preliminary field insulating film 140P1, and the mask layer M are removed. With the partial removal, the third preliminary field insulating film 140P1 may become a third planarized field insulating film 140P2. With the partial removal, the second pre-field insulating film 130P1 may become a second planarized field insulating film 130P2.

An upper surface of the third planarized field insulating film 140P2, and an upper surface of the second planarized field insulating film 130P2 may be substantially coplanar with the upper surface of the first field insulating film 120 and the upper surface of the fin-type pattern F. The term "coplanar" may include a presence of minute stepped portions. The second planarized field insulating film 130P2 may be etched later to become the second field insulating film 130, and the third planarized field insulating film 140P2 may be etched later to become the third field insulating film 140.

Referring back to FIG. 6, the third planarized field insulating film 140P2, the second planarized field insulating film 130P2, and the first field insulating film 120 may be etched to thus form the third field insulating film 140 and the second field insulating film 130. These etching processes may be performed at the same time. For example, the third planarized field insulating film 140P2, the first field insulating film 120 and the second planarized field insulating film 130P2 may be etched simultaneously. The third field insulating film 140 may have a lower etch rate compared to the first field insulating film 120. Accordingly, the upper surface of the third field insulating film may be higher than the upper surface of the first field insulating film 120. Further, the second field insulating film 130 may have a lower etch rate compared to the third field insulating film 140. Accordingly, the upper surface of the second field insulating film 130 may be higher than the upper surface of the third field insulating film 140.

The gate insulating films 211 and 212 may then be formed on the third field insulating film 140, the first field insulating film 120 and the second field insulating film 130. The first gate electrode 210 may then be formed on the gate insulating films 211 and 212. The thickness of the first gate electrode 210 may vary along the second direction of Y1 according to a profile of the upper surfaces of the third field insulating film 140, the first field insulating film 120 and the second field insulating film 130. Accordingly, the thickness of the first gate electrode 210 may be decreased due to the upper surface of the third field insulating film 140 and the upper surface of the second field insulating film 130 which are formed higher than the upper surface of the first field insulating film 120. As a result, the parasitic capacitance between the first gate electrode 210 and the source/drain 115 may be reduced.

Figure 22:
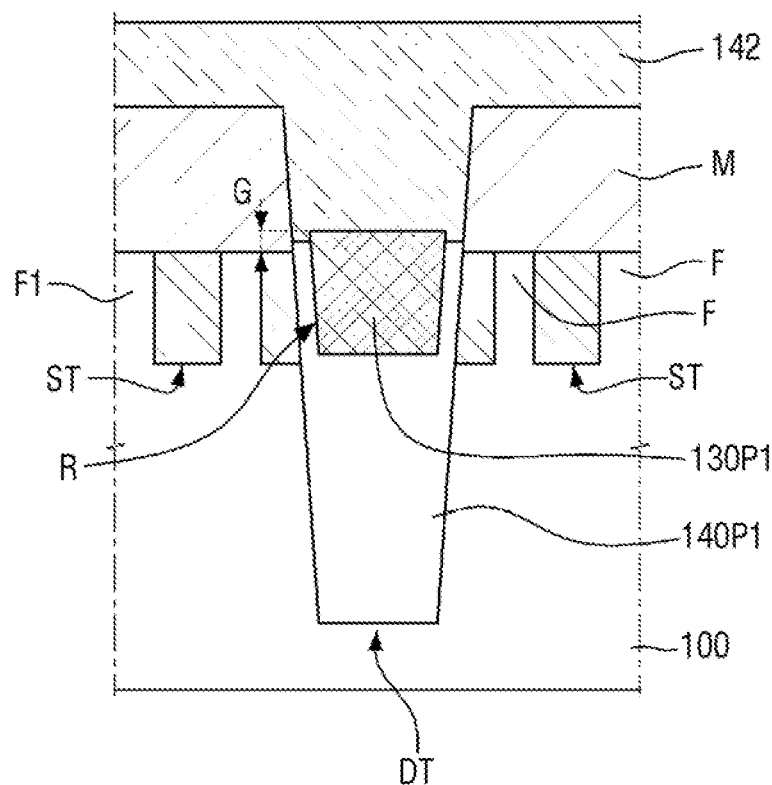
FIG. 22 shows a method of fabricating a semiconductor device according to an exemplary embodiment of the present inventive concept.

Hereinbelow, a method of fabricating a semiconductor device according to an exemplary embodiment will be explained with reference to FIGS. 1, 2, 6, 16, 17, 21 and 22. FIG. 22 shows a method of fabricating a semiconductor device according to an exemplary embodiment. In the following description, the descriptions of those made with reference to the semiconductor devices 1-6 and the method for fabricating a semiconductor device described above will be omitted or will be made as brief as possible for the sake of brevity.

Accordingly, the redundant description of the processes illustrated and described with reference to FIGS. 16 and 17 will be omitted.

Referring to FIG. 22, the third preliminary field insulating film 140P1, the second preliminary field insulating film 130P1 and a third dummy field insulating film 142 are formed.

The third preliminary field insulating film 140P1 may partially fill the deep trench DT. The third preliminary field insulating film 140P1 may be conformally formed along the side surface and the bottom surface of the deep trench DT. The third preliminary field insulating film 140P1 may have a recess formed on the upper surface. The second preliminary field insulating film 130P1 may be formed in the recess R. The third preliminary field insulating film 140P1 may be only partially formed on the side surface of the deep trench DT. The third preliminary field insulating film 140P1 may be etched later to become the third field insulating film 140.

The second preliminary field insulating film 130P1 may partially fill the deep trench DT. For example, the second preliminary field insulating film 130P1 may fill the recess. The second preliminary field insulating film 130P1 may be formed on the third preliminary field insulating film 140P1. The second preliminary field insulating film 130P1 may be etched later to become the second field insulating film 130. The upper surface of the second preliminary field insulating film 130P1 may be formed higher than the upper surface of the third preliminary field insulating film 140P1. However, the present inventive concept is not limited thereto.

The upper surface of the second preliminary field insulating film 130P1 may be formed higher than the fin-type pattern F. A height difference G between the upper surface of the second preliminary field insulating film 130P1 and the upper surface of the fin-type pattern F may have about 50 nm or less, for example, because the upper surface of the second field insulating film 130 has to be lower than the upper surface of the fin-type pattern F after the simultaneous etching of the second preliminary field insulating film 130P1 and the third preliminary field insulating film 140P1.

However, the present inventive concept is not limited thereto. For example, the upper surface of the second pre-field insulating film 130P1 may be formed lower than or equal to the fin-type pattern F.

The third dummy field insulating film 142 may be formed on the second preliminary field insulating film 130P1 and the third pre-field insulating film 140P1. The third dummy field insulating film 142 may completely fill the deep trench DT. The third dummy field insulating film 142 may also be formed conformally on the mask layer M. The third dummy field insulating film 142 and the third preliminary field insulating film 140P1 may be formed of substantially the same material. Accordingly, while the interface between the third dummy field insulating film 142 and the third preliminary field insulating film 140P1 is illustrated herein, in an exemplary embodiment, the interface need exist.

The forming of the third dummy field insulating film 142 may facilitate forming of the coplanar upper surfaces of the third field insulating film 140, the first field insulating film 120 and the second field insulating film 130 during the subsequent planarization process.

The subsequent processes according to FIGS. 21 and 6 are then performed in the same manner as described above.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a first fin-type pattern disposed on a substrate;
a first field insulating film adjacent to a sidewall of the first fin-type pattern; and
a second field insulating film adjacent to a sidewall of the first field insulating film,
wherein the first field insulating film is interposed between the first fin-type pattern and the second field insulating film,
wherein the second field insulating film comprises a first region and a second region, the first region being closer to the sidewall of the first field insulating film,
wherein a height from a bottom of the second field insulating film to an upper surface of the second region is larger than a height from the bottom of the second field insulating film to an upper surface of the first region, and
wherein the upper surface of the first region of the second field insulating film is higher than an upper surface of the first field insulating film.

2. The semiconductor device of claim 1,
wherein the second field insulating film includes a first insulating film and a second insulating film,
and wherein the second insulating film is located under the first insulating film.

3. The semiconductor device of claim 2,
wherein the second insulating film is in contact with the first field insulating film, and the first insulating film is spaced apart from the first field insulating film.

4. The semiconductor device of claim 1,
wherein a width of the first field insulating film is smaller than a width of the second field insulating film.

5. The semiconductor device of claim 1, further comprising:
a stepped portion between the upper surface of the first region and the upper surface of the first field insulating film.

6. A semiconductor device, comprising:
a first fin-type pattern disposed on a substrate;
a first field insulating film adjacent to a sidewall of the first tin-type pattern; and
a second field insulating film adjacent to a sidewall of the first field insulating film,
wherein the first field insulating film is interposed between the first fin-type pattern and the second field insulating film,
wherein the second field insulating film comprises a first region and a second region, the first region being closer to the sidewall of the first field insulating film,
wherein a height from a bottom of the second field insulating film to an upper surface of the second region is larger than a height from the bottom of the second field insulating film to an upper surface of the first region,
wherein the second field insulating film includes a first insulating film and a second insulating film,
wherein the second insulating film is located under the first insulating film, and
wherein the second insulating film comprises a recess receiving the first insulating film.

7. The semiconductor device of claim 6,
wherein an upper surface of an uppermost portion of the second insulating film is higher than an upper surface of the first field insulating film.

8. The semiconductor device of claim 6,
wherein an upper surface of an uppermost portion of the second insulating film is lower than an upper surface of the first insulating film, and
wherein the upper surface of the uppermost portion of the second insulating film is interposed between an upper surface of the first field insulating film and the upper surface of the first insulating film.

9. A semiconductor device, comprising:
a first and a second fin-type patterns spaced from each other;
a first trench disposed between the first and the second fin-type patterns;
a first field insulating film disposed in the first trench;
a recess formed within the first field insulating film;
a second field insulating film disposed in the recess,
wherein a bottom surface of the recess is in contact with an upper surface of the first field insulating film;
a second trench interposed between the first fin-type pattern and the first trench, wherein the second trench is in contact with a sidewall of the first fin-type pattern; and
a third field insulating disposed in the second trench.

10. The semiconductor device of claim 9,
wherein the upper surface of the first field insulating film is lower than an upper surface of the second field insulating film.

11. The semiconductor device of claim 9,
wherein a bottom surface of the first trench is lower than a bottom surface of the second trench.

12. The semiconductor device of claim 9,
wherein a side surface of the third field insulating film and a side surface of the second field insulating film are spaced apart from each other in a distance less than about 30 nm.

13. The semiconductor device of claim 9, further comprising:
a third trend opposite to the first trench with reference to the first fin-type pattern, wherein the third trench is in contact with a sidewall of the second fin-type pattern.

14. A semiconductor device, comprising:
a first trench disposed in a substrate;
a first field insulating film disposed in the first trench;
a second trench penetrating the first field insulating film, wherein a bottom surface of the second trench is lower than a bottom surface of the first trench;
a second field insulating film disposed in the second trench;
a recess formed within the second field insulating film; and
a third field insulating film disposed in the recess,
wherein an upper surface of the third field insulating film is higher than an upper surface of an uppermost portion of the second field insulating film.

15. The semiconductor device of claim 14, further comprising:
a first fin-type pattern;
a second fin-type pattern spaced apart from the first fin-type pattern,
wherein the first trench is interposed between the first fin-type pattern and the second fin-type pattern, and
wherein the first trench is in contact with a sidewall of the first fin-type pattern and a sidewall of the second fin-type pattern.

16. The semiconductor device of claim 14,
wherein the third field insulating film is formed of silicon nitride and the second field insulating film is formed of silicon oxide.

17. The semiconductor device of claim 14,
wherein the upper surface of the third field insulating film comprises a first region of a first height and a second region of a second height which is larger than the first height.

18. The semiconductor device of claim 14,
wherein the third field insulating film and the first field insulating film are in contact with each other.

19. The semiconductor device of claim 14, further comprising:
a gate electrode overlapping the first, the second and the third field insulating films,
wherein the gate electrode includes a first portion, a second portion, and a third portion disposed on the first, the second and the third field insulating films, respectively, and
wherein the first, the second and the third portions are different from each other in thickness.

20. The semiconductor device of claim 14,
wherein the first field insulating film and the second field insulating film are formed of substantially the same first material.

* * * * *